(12) United States Patent
Kim

(10) Patent No.: US 11,422,196 B2
(45) Date of Patent: Aug. 23, 2022

(54) DEVICE FOR ESTIMATING STATE OF CHARGE OF BATTERY

(71) Applicant: LG CHEM, LTD., Seoul (KR)

(72) Inventor: Young-Jin Kim, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 0 days.

(21) Appl. No.: 17/251,597

(22) PCT Filed: Dec. 18, 2019

(86) PCT No.: PCT/KR2019/018004
§ 371 (c)(1),
(2) Date: Dec. 11, 2020

(87) PCT Pub. No.: WO2020/130630
PCT Pub. Date: Jun. 25, 2020

(65) Prior Publication Data
US 2021/0263107 A1    Aug. 26, 2021

(30) Foreign Application Priority Data

Dec. 21, 2018 (KR) .......................... 10-2018-0167869

(51) Int. Cl.
*G01R 31/3842* (2019.01)

(52) U.S. Cl.
CPC ................ *G01R 31/3842* (2019.01)

(58) Field of Classification Search
None
See application file for complete search history.

(56) References Cited

U.S. PATENT DOCUMENTS

| 9,108,524 B2 | 8/2015 | Zhang et al. |
| 2007/0139013 A1 | 6/2007 | Seo et al. |

(Continued)

FOREIGN PATENT DOCUMENTS

| JP | 2017-122622 A | 7/2017 |
| JP | 2017-162661 A | 9/2017 |

(Continued)

OTHER PUBLICATIONS

International Search Report issued in corresponding International Patent Application No. PCT/KR2019/018004, dated Apr. 1, 2020.

(Continued)

*Primary Examiner* — Jas A Sanghera
(74) *Attorney, Agent, or Firm* — Morgan, Lewis & Bockius LLP

(57) ABSTRACT

A device for estimating state of charge of battery of the present disclosure includes: a sensing unit configured to measure at least one of a first voltage and an OCV of a battery; and a processor operably coupled to the sensing unit. The processor is configured to estimate a second voltage of the battery based on the OCV of the battery or a previously estimated first SOC, calculate a counted voltage error by counting a voltage error between the first voltage and the second voltage of the battery, correct the second voltage of the battery depending on whether the counted voltage error is included in a reference error range, and estimate a first SOC of the battery based on the second voltage or the corrected second voltage.

11 Claims, 5 Drawing Sheets

(56) References Cited

U.S. PATENT DOCUMENTS

| | | | |
|---|---|---|---|
| 2007/0139015 A1* | 6/2007 | Seo | G01R 31/3828 |
| | | | 320/132 |
| 2007/0299620 A1 | 12/2007 | Yun et al. | |
| 2013/0090871 A1 | 4/2013 | Akabori et al. | |
| 2014/0149058 A1 | 5/2014 | Moh | |
| 2017/0199247 A1 | 7/2017 | Joe | |

FOREIGN PATENT DOCUMENTS

| KR | 10-0669476 B1 | 1/2007 |
|---|---|---|
| KR | 10-2008-0000160 A | 1/2008 |
| KR | 10-0901559 B1 | 6/2009 |
| KR | 10-1399345 B1 | 5/2014 |
| KR | 10-1767635 B1 | 8/2017 |

OTHER PUBLICATIONS

Lin et al., "State of Charge Estimation Error Due to Parameter Mismatch in a Generalized Explicit Lithium Ion Battery Model", ASME 2011 Dynamic Systems and Control Conference and Bath/ASME Symposium on Fluid Power and Motion Control, May 5, 2012, pp. 393-400.

Extended European Search Report dated Oct. 29, 2021 issued by the European Patent Office for corresponding European patent application No. 19900608.1.

\* cited by examiner

DEVICE FOR ESTIMATING STATE OF CHARGE OF BATTERY

TECHNICAL FIELD

The present application claims priority to Korean Patent Application No. 10-2018-0167869 filed on Dec. 21, 2018 in the Republic of Korea, the disclosures of which are incorporated herein by reference.

The present disclosure relates to a device for estimating a state of charge (SOC) of a battery.

BACKGROUND ART

Recently, the demand for portable electronic products such as notebook computers, video cameras and portable telephones has increased sharply, and electric vehicles, energy storage batteries, robots, satellites and the like have been developed in earnest. Accordingly, batteries allowing repeated charging and discharging are being actively studied.

Batteries commercially available at the present include nickel-cadmium batteries, nickel hydrogen batteries, nickel-zinc batteries, lithium batteries and the like. Among them, the lithium batteries are in the limelight since they have almost no memory effect compared to nickel-based batteries and also have very low self-discharging rate and high energy density.

One of the important parameters in using and managing the battery is a state of charge (SOC). The SOC is a parameter representing a relative ratio of capacity at the present to a maximum capacity representing the electrical energy stored in the battery when the battery is fully charged. The SOC may be expressed as 0 to 1 or 0% to 100%.

An ampere-counting model and an equivalent circuit model are representatively used to estimate the SOC of a battery.

The ampere-counting model measures a current flowing through a battery using a current sensor and estimates a SOC of the battery based on an ampere-counted value obtained by counting the measured current over time. However, due to the measurement error of the current sensor, there is a problem that the difference between the SOC estimated using the ampere-counting model and the actual SOC occurs, and the difference increases as time passes.

The equivalent circuit model is designed to simulate electrical operating characteristics of a battery. However, the battery has nonlinear characteristics depending on the operating condition, and it is very difficult to design the equivalent circuit model to perfectly simulate the nonlinear characteristics of the battery.

In order to solve the disadvantages of the ampere-counting model and the equivalent circuit model described above, there is a technology for estimating a SOC of a battery using an extended Kalman filter. The extended Kalman filter combines the ampere-counting model and the equivalent circuit model to estimate the SOC more accurately, compared to the case of using only one of the ampere-counting model and the equivalent circuit model. That is, it is possible to estimate the SOC of the battery closer to the actual.

In order to estimate the SOC of the battery using the extended Kalman filter, it is necessary to estimate a voltage of the battery. However, in the related art, when an error occurs in the estimated voltage of the battery, the generated error is accumulated to deteriorate the accuracy of the estimated SOC of the battery.

DISCLOSURE

Technical Problem

The present disclosure is designed to solve the problems of the related art, and therefore the present disclosure is directed to providing a device for estimating state of charge of battery, which may accurately estimate a first SOC of a battery, estimated using a second voltage of the battery, by recursively correcting the second voltage of the battery based on a counted voltage error of the battery.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

Various embodiments of the present disclosure to achieve the above object are as follows.

A device for estimating state of charge (SOC) of battery according to an aspect of the present disclosure comprises: a sensing unit configured to measure at least one of a first voltage and an open circuit voltage (OCV) of a battery; and a processor operably coupled to the sensing unit.

The processor may be configured to estimate a second voltage of the battery based on the OCV of the battery or a previously estimated first SOC, calculate a counted voltage error by counting a voltage error between the first voltage and the second voltage of the battery, correct the second voltage of the battery depending on whether the counted voltage error is included in a reference error range, and estimate a first SOC of the battery based on the second voltage or the corrected second voltage.

The processor may be configured to correct the second voltage of the battery by adding or subtracting a correction voltage to/from the second voltage of the battery, when the counted voltage error is not included in the reference error range.

The correction voltage may be set according to a magnitude of the first voltage to reduce the voltage error between the first voltage and the corrected second voltage.

The processor may be configured to check whether the counted voltage error is a positive value or a negative value and correct the second voltage of the battery by adding or subtracting the correction voltage to/from the second voltage of the battery based on the checking result.

The processor may be configured to correct the second voltage of the battery by adding the correction voltage to the second voltage of the battery, when the counted voltage error is a positive value.

The processor may be configured to correct the second voltage of the battery by subtracting the correction voltage from the second voltage of the battery, when the counted voltage error is a negative value.

The sensing unit may be configured to measure a current of the battery further.

The processor may be configured to estimate a second SOC of the battery based on an ampere-counted value obtained by counting the current of the battery, calculate a SOC error between the second SOC and the estimated first SOC, and generate error data by mapping the SOC error and the counted voltage error.

The processor may be configured to set a range of the counted voltage error corresponding to a target range of the SOC error as the reference error range, based on the error data.

The sensing unit may be configured to measure an OCV of the battery further.

The processor may be configured to estimate the second voltage based on the OCV measured by the sensing unit, before the first SOC is previously estimated.

The processor may be configured to estimate the second voltage based on the previously estimated first SOC, after the first SOC is previously estimated.

A battery pack according to another aspect of the present disclosure may comprise the device for estimating state of charge of battery according to an aspect of the present disclosure.

A vehicle according to still another aspect of the present disclosure may comprise the device for estimating state of charge of battery according to an aspect of the present disclosure.

Advantageous Effects

According to at least one of embodiments of the present disclosure, it is possible to more accurately estimate a first SOC of a battery, which estimated using a second voltage of the battery, by recursively correcting the second voltage of the battery based on a counted voltage error of the battery.

The effects of the present disclosure are not limited to the above, and other effects not mentioned herein will be clearly understood by those skilled in the art from the appended claims.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

BEST MODE

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Additionally, in describing the present disclosure, when it is deemed that a detailed description of relevant known elements or functions renders the key subject matter of the present disclosure ambiguous, the detailed description is omitted herein.

The terms including the ordinal number such as "first", "second" and the like, may be used to distinguish one element from another among various elements, but not intended to limit the elements by the terms.

Throughout the specification, when a portion is referred to as "comprising" or "including" any element, it means that the portion may include other elements further, without excluding other elements, unless specifically stated otherwise.

In addition, throughout the specification, when a portion is referred to as being "connected" to another portion, it is not limited to the case that they are "directly connected", but it also includes the case where they are "indirectly connected" with another element being interposed between them.

Hereinafter, a device according to an embodiment of the present disclosure will be described.

Figure 1:
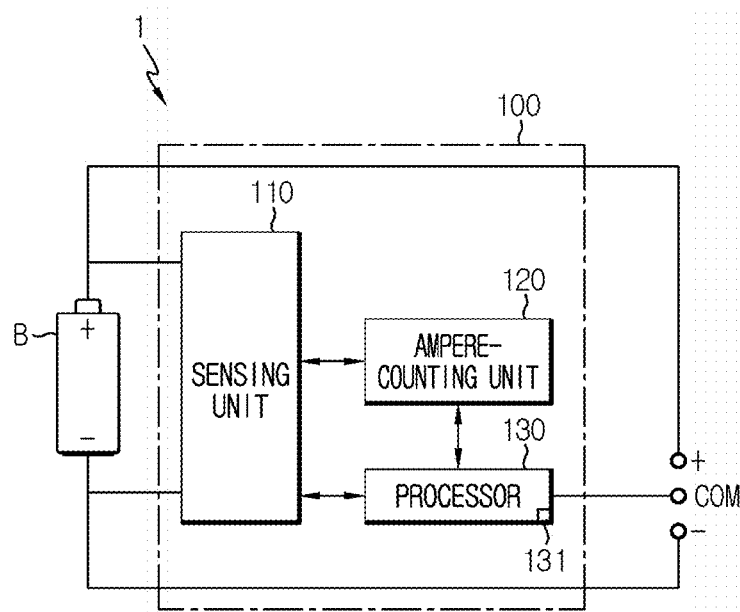
FIG. 1 is a schematic diagram showing a device for estimating state of charge of battery according to an embodiment of the present disclosure.
Figure 2:
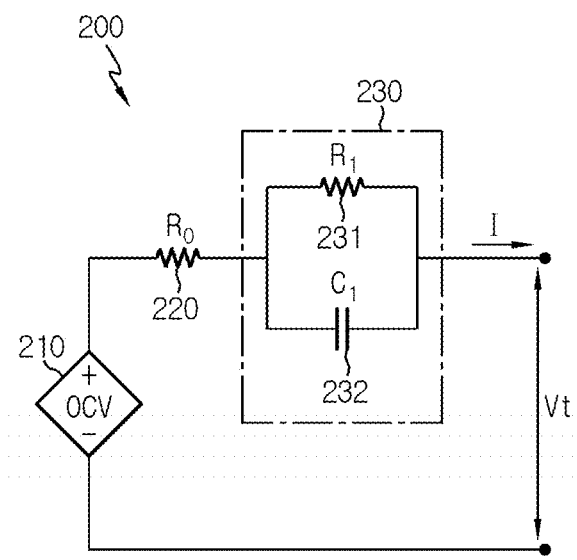
FIG. 2 shows an exemplary equivalent circuit model used by the device for estimating state of charge of battery of FIG. 1.

FIG. 1 is a schematic diagram showing a device for estimating state of charge of battery according to an embodiment of the present disclosure, and FIG. 2 shows an exemplary equivalent circuit model used by the device for estimating state of charge of battery of FIG. 1.

Referring to FIGS. 1 and 2, a battery pack 1 may include a battery B and a device for estimating state of charge of battery 100. The device for estimating state of charge of battery 100 includes a sensing unit 110, an ampere-counting unit 120, and a processor 130.

The sensing unit 110 is operably coupled with the ampere-counting unit 120 and the processor 130. That is, the sensing unit 110 may be connected to the ampere-counting unit 120 and the processor 130 to transmit an electrical signal to the ampere-counting unit 120 and the processor 130 or to receive an electrical signal from the ampere-counting unit 120 and the processor 130, respectively.

The sensing unit 110 may measure a first voltage applied between a positive electrode and a negative electrode of the battery B at every predetermined cycle and output a signal indicating the measured first voltage to the processor 130. In addition, the sensing unit 110 may repeatedly measure a current flowing into or out of the battery B and provide a signal indicating the measured current to at least one of the ampere-counting unit 120 and the processor 130.

The sensing unit 110 includes a current sensor configured to measure the current of the battery B. In addition, the sensing unit 110 may further include a voltage sensor configured to measure the first voltage of the battery B.

Moreover, the sensing unit 110 may further include a temperature sensor configured to measure the temperature of the battery B.

The ampere-counting unit 120 is operably coupled with the sensing unit 110 and the processor 130. The ampere-counting unit 120 is configured to calculate an ampere-counted value at every predetermined cycle. At this time, a Coulomb counter may be used as the ampere-counting unit 120. The unit of the ampere-counted value may be 'Ah (ampere hour)'.

Specifically, the ampere-counting unit 120 may repeat a process of calculating an ampere-counted value for a pre-determined cycle based on the current measured by the sensing unit 110 and transmitting a signal indicating the calculated ampere-counted value to the processor 130, at every predetermined cycle.

The processor 130 is operably coupled with the sensing unit 110 and the ampere-counting unit 120. The processor 130 may estimate a second SOC of the battery B based on the ampere-counted value calculated by the ampere-counting unit 120. The processor 130 may estimate the second SOC of the battery B at every predetermined cycle based on the ampere-counted value through an ampere-counting model.

In the ampere-counting model, the ampere-counted value and the second SOC of the battery B may be defined as in Equation 1 below.

$$SOC2_{k+1} = SOC2_k + \frac{I_k \Delta t}{Q_{max}} \qquad \langle\text{Equation 1}\rangle$$

In Equation 1, k used as a subscript is a time index, which is a value that increases by 1 at every predetermined cycle. In addition, SOC2 is a second SOC, I is a current measured by the sensing unit 110, and $\Delta t$ is a time length of the predetermined cycle. $Q_{max}$ represents a maximum capacity of the battery B. Also, $Ik\Delta t$ is an ampere-counted value Meanwhile, the processor 130 may estimate a first SOC of the battery B at every predetermined cycle equal to the cycle at which the second SOC is estimated using an estimation algorithm that does not use the ampere-counted value. In an embodiment, the processor 130 may estimate the first SOC of the battery B using an extended Kalman filter. At this time, the processor 130 may estimate a second voltage of the battery B, explained later, and estimate the first SOC of the battery B using the estimated second voltage as an input parameter of the extended Kalman filter.

The processor 130 may transmit a message indicating the estimated SOC to an external device (for example, an ECU of a vehicle, a display, or the like) via a communication terminal COM.

The processor 130 may selectively include an application-specific integrated circuit (ASIC), another chipset, a logic circuit, a register, a communication modem, and a data processing device. At least one of the various control logics executable by the processor 130 may be combined, and the combined control logic is written in a computer-readable code system and recorded on a computer-readable recording medium. The recording medium has no limitation as long as it can be accessed by the processor 130 included in a computer. As one example, the recording medium includes at least one selected from the group consisting of a ROM, a RAM, a register, a CD-ROM, a magnetic tape, a hard disk, a floppy disk and an optical data recording device. In addition, the code system may be modulated into a carrier signal and stored in a communication carrier at a specific time, and may be stored and executed in a distributed manner on computers connected through a network. Moreover, functional programs, code and segments for implementing the combined control logics may be easily inferred by programmers in the technical field to which the present disclosure belongs.

The processor 130 may include a memory 131. The memory 131 may is not particularly limited as long as it is known in the art as being capable of recording, erasing, updating and reading data. For example, the memory 131 may be DRAM, SDRAM, a flash memory, ROM, EEPROM, a register, and the like. In addition, the memory 131 may store program codes defining processes that can be executed by the processor 130. In particular, in the memory 131, data defining parameters required for executing the extended Kalman filter, the ampere-counting model and the equivalent circuit model are stored in advance.

The processor 130 may estimate the second voltage of the battery B based on the estimated first SOC of the battery B. More specifically, the processor 130 may estimate the second voltage of the battery B using the equivalent circuit model.

Referring to FIG. 2, the equivalent circuit model 200 includes an OCV source 210, an internal resistor 220 and a RC circuit 230. As shown in FIG. 2, the OCV source 210, the internal resistor 220 and the RC circuit 230 may be connected in series with each other.

The OCV source 210 simulates the OCV that is a voltage between the positive electrode and the negative electrode of the battery B electrochemically stabilized for a long time, and the OCV has a nonlinear function relationship with the first SOC of the battery B. That is, OCV=$f_1$(SOC1) and SOC1=$f_2$(OCV), and so $f_1$ and $f_2$ represent different functions.

The OCV formed by the OCV source 210 may be defined in advance for various first SOCs and temperatures through preliminary experiments.

That is, for each of a plurality of predetermined temperatures, the change in OCV according to the first SOC of the battery B may be measured, and data indicating the relationship between the first SOC and the OCV of the battery B may be stored in the memory 131 in advance in the form of a look-up table. For example, if the number of temperatures used in the preliminary experiment is m, a look-up table showing the m number of OCV-SOC curves may be stored in the memory in advance.

Thus, the processor 130 may estimate the OCV formed by the OCV source 210 by putting the first SOC into the OCV-SOC curve.

However, before the first SOC is estimated, for example at an initial operation, the OCV of the battery B may be measured by the sensing unit 110. In addition, the processor 130 may use the OCV of the battery B measured by the sensing unit 110 as the OCV formed by the OCV source 210.

Figure 3:
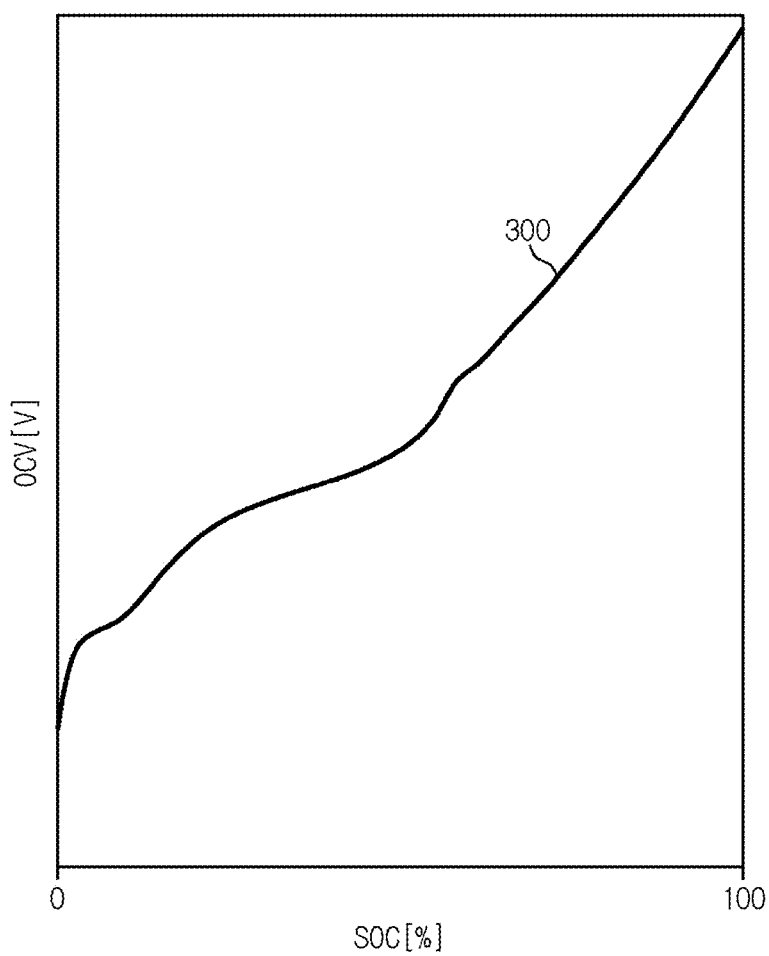
FIG. 3 shows an exemplary OCV curve representing the relationship between a first SOC and an OCV of the battery.

FIG. 3 shows an exemplary OCV curve representing the relationship between a first SOC and an OCV of the battery B.

Seeing the OCV curve 300 of FIG. 3, in the environment where the temperature of the battery B is maintained at a specific value (for example, 30° C.), it is possible to check the change of the recorded OCV in the range of SOC 0% to 100%. As being easily understood, as the SOC increases from 0% toward 100%, the OCV increases nonlinearly. Conversely, as the SOC decreases from 100% toward 0%, the OCV decreases nonlinearly.

The internal resistor 220 simulates an IR drop of the battery B. The IR drop means a voltage drop that is an instantaneous change in the both-terminal voltage of the battery B when the battery B is charged or discharged. Due to the IR drop, the voltage measured at a time point when charging for the battery B in a no-load state starts is greater than the OCV. Conversely, the voltage measured at a time point when discharge for the battery B in a no-load state starts is smaller than the OCV. The resistance ($R_0$) of the internal resistor 220 may also be set differently for a plurality of predetermined temperatures through preliminary experiments.

The RC circuit 230 simulates an over-potential induced by an electric double layer of the battery B, or the like and includes a resistor 231 and a capacitor 232 connected in parallel to each other. $R_1$ is a resistance of the resistor 231 and $C_1$ is a capacitance of the capacitor 232. The over-potential may also be called a 'polarization voltage'. Each of $R_1$ and $C_1$ may be set differently for a plurality of predetermined temperatures through preliminary experiments.

In the equivalent circuit model 200, the over-potential may be defined as in Equation 2 below.

$$Vop_{k+1} = Vop_k \left\{\exp\left(-\frac{\Delta t}{R_1 C_1}\right)\right\} + R_1\left\{1 - \exp\left(-\frac{\Delta t}{R_1 C_1}\right)\right\}I_k \qquad \text{<Equation 2>}$$

In Equation 2, k used as a subscript is a time index, which is a value that increases by 1 at every predetermined cycle. In addition, Vop is an over-potential, I is a current measured by the sensing unit 110, and $\Delta t$ is a time length of a predetermined cycle. $R_1$ is a resistance of the resistor 231, and $C_1$ is a capacitance of the capacitor 232.

The processor 130 may determine the OCV, which is one of parameters related to the equivalent circuit model 200, with reference to data stored in the memory based on the previously estimated first SOC of the battery B and the temperature of the battery B measured by the sensing unit 110, at every predetermined cycle.

The processor 130 may determine the resistance ($R_0$) of the internal resistor 220, the resistance ($R_1$) of the resistor 231 and the capacitance ($C_1$) of the capacitor 232, which are a plurality of other circuit parameters related to the equivalent circuit model 200, with reference to the data stored in advance in the memory, based on the temperature of the battery B measured by the sensing unit 110, at every predetermined cycle.

Through this, the processor 130 may estimate the second voltage of the battery B by applying the determined parameter to the equivalent circuit model 200. That is, the processor 130 may calculate a terminal voltage (Vt) of the equivalent circuit model 200 to which the determined parameter is applied, and estimate the same as the second voltage of the battery B.

At this time, the processor 130 may estimate the second voltage of the battery B using Equation 3 below.

$$V2_k = OCV_k + R_0 I_k + Vop_k \qquad \text{<Equation 3>}$$

In Equation 3, k used as a subscript is a time index, which is a value that increases by 1 at every predetermined cycle. In addition, V2 is a second voltage of the battery B, OCV is an OCV of the battery B, and $R_0$ is a resistance of the internal resistor 220. I is a current measured by the sensing unit 110, and Vop represents an over-potential.

The processor 130 may calculate a counted voltage error by counting a voltage error of the estimated second voltage of the battery B compared to the first voltage of the battery B measured by the sensing unit 110.

At this time, the processor 130 may calculate the counted voltage error using Equation 4 below.

$$\Sigma Verror_{k+1} = \Sigma Verror_k + (V1_k - V2_k) \qquad \text{<Equation 4>}$$

In Equation 4, k used as a subscript is a time index, which is a value that increases by 1 at every predetermined cycle. In addition, ΣVerror is a counted voltage error, V1 is a first voltage of the battery B measured by the sensing unit 110, and V2 represents an estimated second voltage of the battery B.

The processor 130 may determine whether the counted voltage error is included in a reference error range and correct the second voltage of the battery B based on the determination result.

Specifically, as a result of determining whether the counted voltage error is included in the reference error range, if the counted voltage error is not included in the reference error range, the processor 130 may correct the second voltage of the battery B by adding or subtracting a correction voltage to/from the second voltage of the battery B.

Conversely, as a result of determining whether the counted voltage error is included in the reference error range, if the counted voltage error is included in the reference error range, the processor 130 may estimate the first SOC of the battery B based on the currently estimated second voltage of the battery B.

Here, the reference error range may be a range serving as a reference for determining whether to correct the second voltage of the battery B or not. At this time, processor 130 may set the reference error range. The process of setting the reference error range by the processor 130 will be described later.

As a result of determining whether the counted voltage error is included in the reference error range, if the counted voltage error is not included in the reference error range, the processor 130 may check whether the counted voltage error is a positive value or a negative value and correct the second voltage of the battery B by adding and subtracting the correction voltage to/from the second voltage of the battery B based on the checking result.

Specifically, if the counted voltage error is a positive value, the processor 130 may correct the second voltage of the battery B by adding the correction voltage to the second voltage of the battery B.

Conversely, if the counted voltage error is a negative value, the processor 130 may correct the second voltage of the battery B by subtracting the correction voltage from the second voltage of the battery B.

Through the present disclosure as above, if the counted voltage error is a positive value due to the tendency that the second voltage of the battery B is estimated as a voltage smaller than the first voltage of the battery B, the processor 130 may accurately correct the second voltage of the battery B by adding the correction voltage to the second voltage of the battery B.

If the counted voltage error is a negative value due to the tendency that the second voltage of the battery B is estimated as a value greater than the first voltage of the battery B, the processor 130 may accurately correct the second voltage of the battery B by subtracting the correction voltage from the second voltage of the battery B.

Meanwhile, the processor 130 may set the correction voltage that is added to or subtracted from the second voltage of the battery B to correspond to the first voltage of the battery B. Specifically, the processor 130 may set the correction voltage such that the correction voltage is greater as the first voltage of the battery B is greater. That is, if the counted voltage error is not included in the reference error range, the processor 130 may check the first voltage of the battery B and set the correction voltage to be greater as the first voltage of the battery B is greater.

For example, as a result of checking the first voltage of the battery B because the counted voltage error is not included in the reference error range, if the currently checked first voltage of the battery B has increased greater than the previously checked first voltage of the battery B, the processor 130 may set the correction voltage to be greater than the previously set correction voltage.

According to the present disclosure, the processor 130 may correct the second voltage of the battery B by adding or subtracting the correction voltage whose magnitude is set differently in response to a voltage region of the battery B.

Hereinafter, the process of setting the reference error range by the processor 130 will be described.

Figure 4:
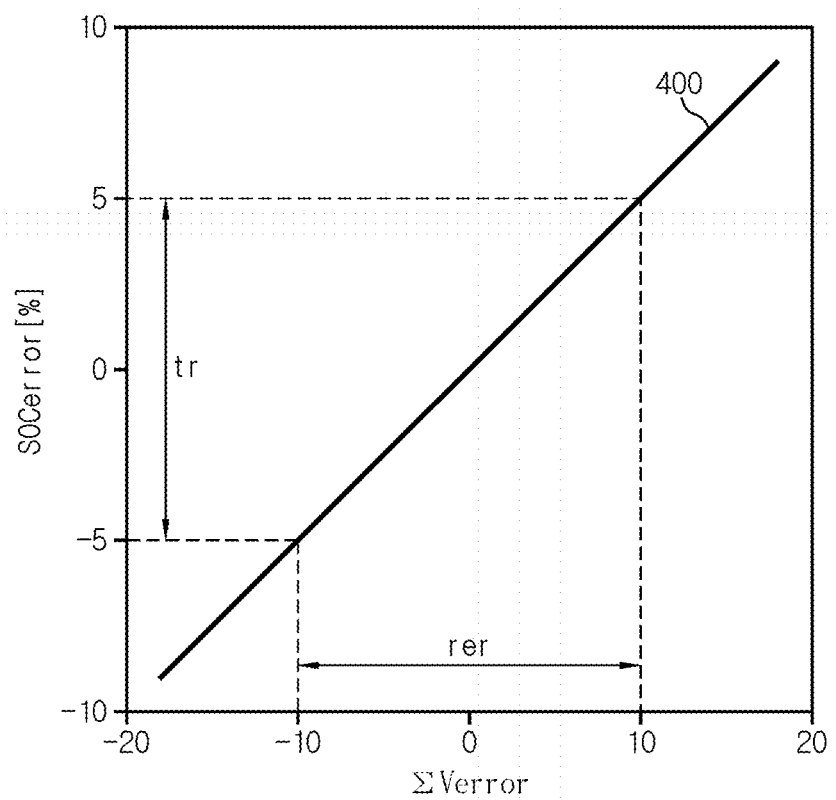
FIG. 4 shows error data in which a SOC error and a counted voltage error are mapped.

FIG. 4 shows error data 400 in which a SOC error and a counted voltage error are mapped.

Referring to FIG. 4 further, the processor 130 may calculate an SOC error of the first SOC of the battery B compared to the estimated second SOC of the battery B, and generate error data 400 by mapping the SOC error and the counted voltage error.

The processor 130 may calculate a difference between the second SOC of the battery B and the first SOC of the battery B respectively estimated at the same time point as the SOC error. In addition, the processor 130 may generate the error data 400 by mapping the SOC error and the counted voltage error calculated based on the same time point.

That is, the processor 130 may calculate the SOC error according to the difference between the second SOC and the first SOC estimated at the time point a and generate the error data 400 by mapping the calculated SOC error with the counted voltage error calculated at the time point a.

The processor 130 may set the range of the counted voltage error corresponding to a target range (tr) of the SOC error as the reference error range (rer) based on the error data 400.

Specifically, the processor 130 may derive a relationship function where the SOC error is an output value (Y) and the counted voltage error is an input value (X), based on the error data 400. At this time, the relationship function may be a linear function.

This relationship function may be defined as in Equation 5 below.

$$SOC_{error} = g \times \Sigma Verror + c \qquad \text{<Equation 5>}$$

In Equation 5, SOCerror is a SOC error, g is a slope of the relationship function, ΣVerror is a counted voltage error, and c is a Y-intercept of the relationship function.

For example, as shown in FIG. 4, the processor 130 may derive a linear function SOCerror=0.5×ΣVerror where the slope g is "0.5" and the Y-intercept c is "0".

By using this, the processor 130 may calculate the range of the counted voltage error corresponding to the target range (tr) of the preset SOC error, and set the calculated range as the reference error range (rer).

For example, if the target range (tr) of the preset SOC error is "−5.0% to 5.0%", the processor 130 may calculate the range of the counted voltage error as "−10 to 10" using the relationship function, and set the calculated range "−10 to 10" as the reference error range (rer). Here, the unit of the reference error range is a unit corresponding to the first voltage and may be mV or V.

According to the present disclosure, by setting the reference error range according to the current state of the battery B, the second voltage of the battery B may be corrected whenever the counted voltage error is out of the reference error range. Thus, the first SOC of the battery B may be accurately estimated based on the corrected second voltage.

Figure 5:
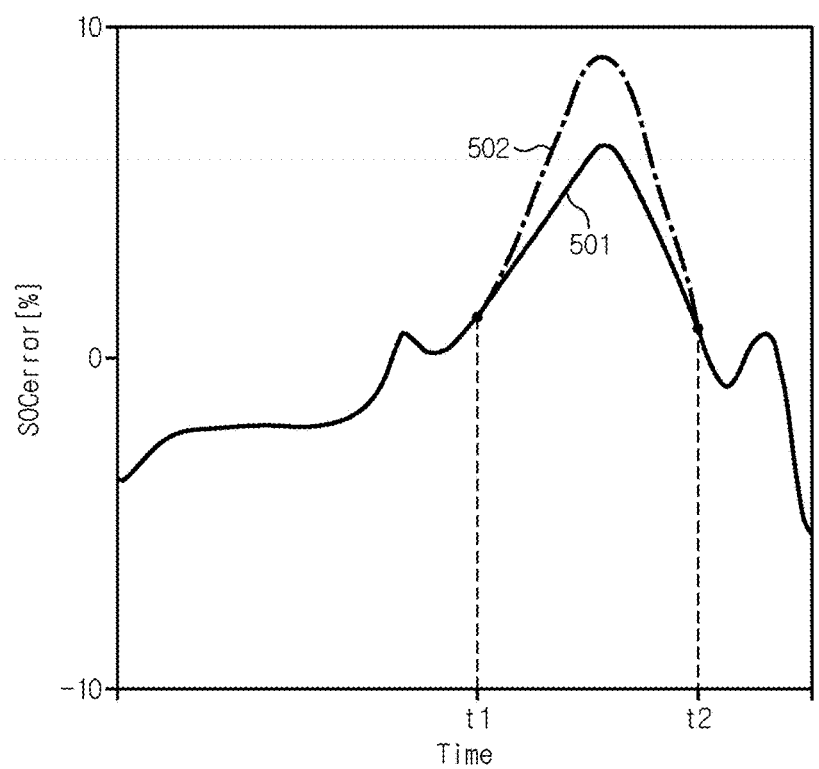
FIG. 5 is a graph showing a SOC error of the first SOC estimated before and after correcting the second voltage of the battery according to an embodiment of the present disclosure.

FIG. 5 is a graph showing a SOC error of the first SOC estimated before and after correcting the second voltage of the battery B according to an embodiment of the present disclosure.

Referring to FIG. 5, a period from a first time point t1 to a second time point t2 is a time point in which the accumulated voltage error of the battery B is out of the reference error range. A first curve 501 is a curve indicating the SOC error between the second SOC of the battery B and the first SOC estimated based on the corrected second voltage. A second curve 502 is a curve indicating the SOC error between the second SOC of the battery B and the first SOC estimated based on the uncorrected second voltage.

The processor 130 may correct the second voltage of the battery B during the period from the first time point t1 to the second time point t2 at which the accumulated voltage error is out of the reference error range, and estimate the first SOC of the battery B again based on the corrected second voltage.

Accordingly, during the period from the first time point t1 to the second time point t2, the SOC error of the second curve 502 may be greater than the SOC error of the first curve 501.

That is, the device for estimating state of charge of battery 100 according to an embodiment of the present disclosure may correct the second voltage according to whether the counted voltage error is included in the reference error range, and estimate the first SOC of the battery B again based on the corrected second voltage. Thus, the device for estimating state of charge of battery 100 has an advantage of accurately estimating the first SOC by correcting the second voltage.

Figure 6:
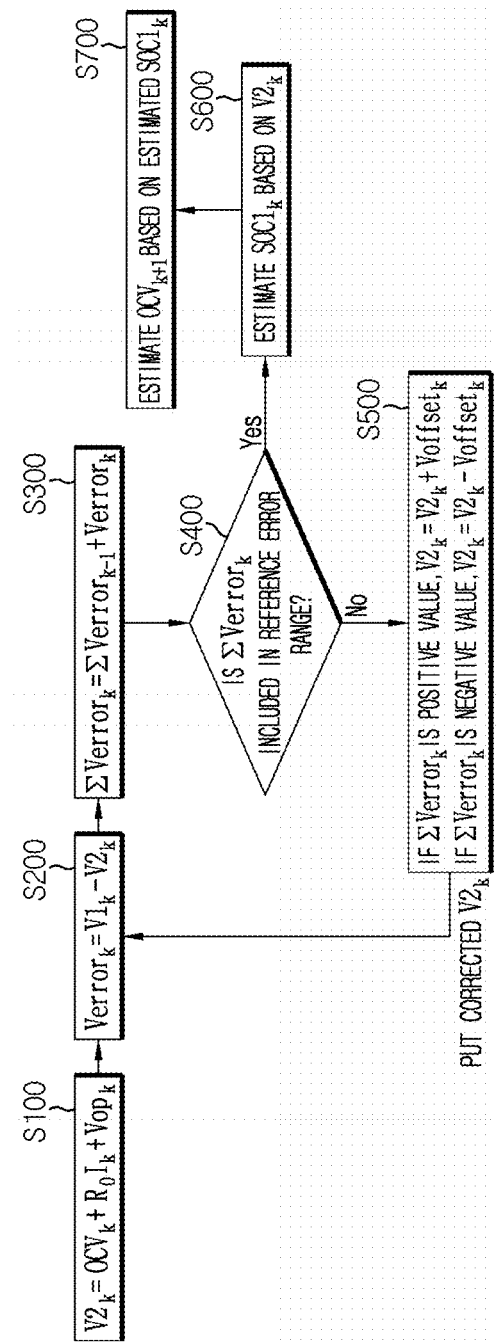
FIG. 6 is a diagram schematically showing an operation procedure of the device for estimating state of charge of battery according to an embodiment of the present disclosure.

FIG. 6 is a diagram schematically showing an operation procedure of the device for estimating state of charge of battery 100 according to an embodiment of the present disclosure.

Specifically, FIG. 6 is a diagram showing a first operation (S100), a second operation (S200), a third operation (S300), a fourth operation (S400), a fifth operation (S500), a sixth operation (S600) and a seventh operation (S700), which are performed by the processor 130 at a time point k. However, the processor 130 performs various operations to implement the present disclosure, and it should be noted that FIG. 6 is a diagram selectively showing only the first operation (S100) to the seventh operation (S700) among various operations of the processor 130.

Hereinafter, the operations of the processor 130 at the time point k will be described. That is, the subscript k means a value of a current time point, the subscript k−1 means a value of a previous time point, and the subscript k+1 means a value of the next time point.

The first operation (S100) is an operation in which the processor 130 estimates the second voltage ($V2_k$).

The processor 130 may estimate the second voltage ($V2_k$) based on Equation 3.

Here, the OCV ($OCV_k$) may be measured by the sensing unit 110 or, if the first SOC ($SOC1_{k-1}$) is estimated in advance, may be estimated by the first SOC ($SOC1_{k-1}$) estimated in advance.

For example, if the first SOC ($SOC1_{k-1}$) is not estimated in advance, the processor 130 may estimate the second voltage ($V2_k$) based on the OCV ($OCV_k$) of the battery B measured by the sensing unit 110. Referring to the sixth operation (S600) explained later, the first SOC ($SOC1_k$) may be estimated based on the second voltage ($V2_k$). Thus, when k=1, namely at the first time point, the second voltage ($V2_k$) may be estimated by the OCV ($OCV_k$) measured by the sensing unit 110.

Conversely, if the first SOC ($SOC1_{k-1}$) is estimated in advance, the processor 130 may estimate the OCV ($OCV_k$) from the previously estimated first SOC ($SOC1_{k-1}$) with reference to the OCV curve 300 of FIG. 3. That is, if k≥2, the first SOC ($SOC1_{k-1}$) may be estimated in advance by the second voltage ($V2_k$) estimated at the time point k-1. Accordingly, the processor 130 may estimate the OCV ($OCV_k$) based on the first estimated SOC ($SOC1_{k-1}$) and estimate the second voltage ($V2_k$) based on the estimated OCV ($OCV_k$).

The second operation (S200) is an operation in which the processor 130 calculates a voltage error ($Verror_k$).

The processor 130 may calculate the voltage error ($Verror_k$) by obtaining a difference between the first voltage ($V1_k$) measured by the sensing unit 110 and the second voltage ($V2_k$) estimated in the first operation (S100).

The third operation (S300) is an operation in which the processor 130 calculates a counted voltage error ($\Sigma Verror_k$).

The processor 130 may calculate the counted voltage error ($\Sigma Verror_k$) at the time point k by summing the counted voltage error ($\Sigma Verror_{k-1}$) calculated at the time point k-1 and the voltage error ($Verror_k$) calculated in the second operation (S200). That is, the processor 130 may calculate the counted voltage error ($\Sigma Verror_k$) at the current time point k by summing the counted voltage error ($\Sigma Verror_{k-1}$) calculated in advance at the previous time point k-1 and the voltage error ($Verror_k$) calculated at the current time point (k).

The fourth operation (S400) is an operation in which the processor 130 compares the counted voltage error ($\Sigma Verror_k$) with a reference error range (rer).

Here, the reference error range (rer) may be set based on the error data 400 that is generated by mapping the SOC error (SOCerror) and the counted voltage error ($\Sigma Verror_k$).

For example, as shown in FIG. 4, the SOC error (SOCerror) and the counted voltage error ($\Sigma Verror_k$) may be mapped.

The processor 130 may set a range of the counted voltage error ($\Sigma Verror_k$) corresponding to a target range (tr) of the SOC error (SOCerror) as the reference error range (rer). Here, the target range (tr) of the SOC error (SOCerror) may be set in advance. For example, the target range (tr) of the SOC error (SOCerror) may be set to be equal to and greater than −5% and smaller than +5%.

If k=1, since the first SOC ($SOC1_k$) is not yet estimated, the SOC error (SOCerror) may not be calculated. In this case, the fourth operation (S400) may be omitted, and the sixth operation (S600) may be performed.

Conversely, when k≥2, the processor 130 may generate the error data 400 and set the reference error range (rer). Further, the processor 130 may be configured to perform the fifth operation (S500) or the sixth operation (S600) according to whether the counted voltage error ($\Sigma Verror_k$) is included in the reference error range (rer).

The fifth operation (S500) is an operation in which the processor 130 corrects the second voltage ($V2_k$) of the battery, if the counted voltage error ($\Sigma Verror_k$) is not included in the reference error range (rer).

Specifically, if the counted voltage error ($\Sigma Verror_k$) is not included in the reference error range (rer), the processor 130 may correct the second voltage ($V2_k$) by adding or subtracting the correction voltage ($Voffset_k$) to/from the estimated second voltage ($V2_k$).

Preferably, if the counted voltage error ($\Sigma Verror_k$) is a positive value and is not included in the reference error range (rer), the processor 130 may correct the second voltage ($V2_k$) by adding the correction voltage ($Voffset_k$) to the second voltage ($V2_k$). That is, if the counted voltage error ($\Sigma Verror_k$) is greater than the reference error range (rer), the processor 130 may reduce the counted voltage error ($\Sigma Verror_k$) by adding the correction voltage ($Voffset_k$) to the second voltage ($V2_k$).

Conversely, if the counted voltage error ($\Sigma Verror_k$) is a negative value and is not included in the reference error range (rer), the processor 130 may correct the second voltage ($V2_k$) by subtracting the correction voltage ($Voffset_k$) from the second voltage ($V2_k$). That is, if the counted voltage error ($\Sigma Verror_k$) is smaller than the reference error range (rer), the processor 130 may increase the counted voltage error ($\Sigma Verror_k$) by subtracting the correction voltage ($Voffset_k$) from the second voltage ($V2_k$). Here, the correction voltage ($Voffset_k$) may be set to correspond to the magnitude of the first voltage ($V1_k$) measured by the sensing unit 110. For example, as the first voltage ($V1_k$) is greater, the correction voltage ($Voffset_k$) may be set to be greater.

After the fifth operation (S500), the second operation (S200) may be performed again based on the corrected second voltage ($V2_k$). That is, based on the second voltage ($V2_k$) corrected in the fifth operation (S500), the second operation (S200), the third operation (S300), the fourth operation (S400) and the fifth operation (500) may be performed recursively until the counted voltage error ($\Sigma Verror_k$) calculated at the time point k is included in the reference error range (rer).

The sixth operation (S600) is an operation in which the processor 130 estimates the first SOC ($SOC1_k$) of the battery B based on the estimated second voltage ($V2_k$) or the corrected second voltage ($V2_k$).

For example, if k=1, after the third operation (S300), the fourth operation (S400) may be omitted and the fifth operation (S500) may be performed. In this case, the processor 130 may estimate the second voltage ($V2_k$) based on the OCV ($OCV_k$) of the battery measured by the sensing unit 110, and estimate the first SOC ($SOC1_k$) of the battery according to the estimated second voltage ($V2_k$).

As another example, if k≥2 and the fifth operation (S500) is not performed, the processor 130 may estimate the first SOC ($SOC1_k$) based on the second voltage ($V2_k$) estimated in the first operation (S100) at the corresponding time point. Preferably, in this case, the second voltage ($V2_k$) estimated in the first operation (S100) at the time point k may not be corrected.

As still another example, if k≥2 and the fifth operation (S500) is performed more than once, the processor 130 may estimate the first SOC ($SOC1_k$) based on the second voltage ($V2_k$) finally corrected in the fifth operation (S500). That is, the processor 130 may recursively correct the second voltage ($V2_k$) according to the comparison result of the counted voltage error ($\Sigma Verror_k$) and the reference error range (rer), and finally estimate the first SOC ($SOC1_k$) based on the finally corrected second voltage ($V2_k$).

The seventh operation (S700) is an operation in which the processor 130 estimates the OCV ($OCV_{k+1}$) of the battery B based on the estimated first SOC ($SOC1_k$).

Specifically, the seventh operation (S700) is an operation in which the processor 130 estimates the OCV ($OCV_{k+1}$) of the battery B at the time point k+1 based on the first SOC ($SOC1_k$) estimated at the time point k. The OCV ($OCV_{k+1}$) of the time point k+1 may be estimated in the seventh operation (S700), and the second voltage ($V2_{k+1}$) at the time point k+1 may be estimated by the estimated OCV ($OCV_{k+1}$).

In addition, the processor 130 may calculate the SOC error ($SOCerror_k$) by obtaining a difference between the first SOC ($SOC1_k$) estimated in the sixth operation (S600) and the second SOC ($SOC2_k$) estimated based on the ampere-counted value counted by the ampere-counting unit 120.

For example, seeing the first curve 501 and the second curve 502 in the embodiment of FIG. 5, the error of the SOC may be lowered as the processor 130 performs the first operation (S100) to the seventh operation (S700).

That is, the device for estimating state of charge of battery 100 according to an embodiment of the present disclosure has an advantage of lowering the error of the estimated SOC by measuring and estimating the voltage of the battery B recursively and correcting the estimated voltage of the battery B based on the reference error range.

The embodiments of the present disclosure described above are not necessarily implemented by a device but may also be implemented through a program for realizing functions corresponding to the configuration of the present disclosure or a recording medium on which the program is recorded. Such implementation may be easily performed by those skilled in the art from the above description of the embodiments.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Additionally, many substitutions, modifications and changes may be made to the present disclosure described hereinabove by those skilled in the art without departing from the technical aspects of the present disclosure, and the present disclosure is not limited to the above-described embodiments and the accompanying drawings, and each embodiment may be selectively combined in part or in whole to allow various modifications.

REFERENCE SIGNS

1: battery pack
B: battery
100: device for estimating state of charge of battery
110: sensing unit
120: ampere-counting unit
130: processor
200: equivalent circuit model

What is claimed is:

1. A device for estimating a state of charge (SOC) of a battery, comprising:
a sensing unit configured to measure at least one of a first voltage and an open circuit voltage (OCV) of the battery; and
a processor operably coupled to the sensing unit,
wherein the processor is configured to estimate a second voltage of the battery based on the OCV of the battery or a previously estimated first SOC, calculate a counted voltage error by counting a voltage error between the first voltage and the second voltage of the battery, correct the second voltage of the battery depending on whether the counted voltage error is included in a reference error range, and estimate a first SOC of the battery based on the second voltage or the corrected second voltage.

2. The device for estimating the state of charge of the battery according to claim 1,
wherein the processor is configured to correct the second voltage of the battery by adding or subtracting a correction voltage to/from the second voltage of the battery, when the counted voltage error is not included in the reference error range.

3. The device for estimating the state of charge of the battery according to claim 2,
wherein the correction voltage is set according to a magnitude of the first voltage to reduce the voltage error between the first voltage and the corrected second voltage.

4. The device for estimating the state of charge of the battery according to claim 2,
wherein the processor is configured to check whether the counted voltage error is a positive value or a negative value and correct the second voltage of the battery by adding or subtracting the correction voltage to/from the second voltage of the battery based on the checking result.

5. The device for estimating the state of charge of the battery according to claim 4,
wherein the processor is configured to correct the second voltage of the battery by adding the correction voltage to the second voltage of the battery, when the counted voltage error is a positive value.

6. The device for estimating the state of charge of the battery according to claim 4,
wherein the processor is configured to correct the second voltage of the battery by subtracting the correction voltage from the second voltage of the battery, when the counted voltage error is a negative value.

7. The device for estimating the state of charge of the battery according to claim 1,
wherein the sensing unit is configured to measure a current of the battery, and
the processor is configured to estimate a second SOC of the battery based on an ampere-counted value obtained by counting the current of the battery, calculate a SOC error between the second SOC and the estimated first SOC, and generate error data by mapping the SOC error and the counted voltage error.

8. The device for estimating the state of charge of the battery according to claim 7,
wherein the processor is configured to set a range of the counted voltage error corresponding to a target range of the SOC error as the reference error range, based on the error data.

9. The device for estimating the state of charge of the battery according to claim 1,
wherein the sensing unit is configured to measure the OCV of the battery, and
the processor is configured to:
estimate the second voltage based on the OCV measured by the sensing unit, before the first SOC is previously estimated, and
estimate the second voltage based on the previously estimated first SOC, after the first SOC is previously estimated.

10. A battery pack, comprising the device for estimating the state of charge of the battery according to claim 1.

11. A vehicle, comprising the device for estimating the state of charge of the battery according to claim 1.

* * * * *